United States Patent
Wang

(10) Patent No.: US 10,523,163 B2
(45) Date of Patent: Dec. 31, 2019

(54) POWER AMPLIFIER AND WIRELESS COMMUNICATION DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventor: Tong Wang, Kawasaki Kanagawa (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 0 days.

(21) Appl. No.: 16/125,878

(22) Filed: Sep. 10, 2018

(65) Prior Publication Data

US 2019/0229687 A1    Jul. 25, 2019

(30) Foreign Application Priority Data

Jan. 22, 2018 (JP) .................... 2018-007877

(51) Int. Cl.
*H04B 1/04* (2006.01)
*H03F 3/21* (2006.01)
(Continued)

(52) U.S. Cl.
CPC ............... *H03F 3/21* (2013.01); *H03F 3/45* (2013.01); *H04B 1/04* (2013.01); *H03F 1/56* (2013.01);
(Continued)

(58) Field of Classification Search
CPC ...... H04B 1/04; H04B 1/0408; H04B 1/0433; H04B 1/0475; H04B 1/16; H04B 1/40;
(Continued)

(56) References Cited

U.S. PATENT DOCUMENTS 6,191,650 B1    2/2001  Backram et al.
6,683,494 B2 *  1/2004  Stanley ............... H03F 3/2175
                                                      330/10

(Continued)

FOREIGN PATENT DOCUMENTS

JP    3578773 B2    10/2004
JP    2008-17358 A   1/2008
(Continued)

OTHER PUBLICATIONS

A. Ba, et al., "A 2.4GHz Class-D Power Amplifier with Conduction Angle Calibration for −50dBc Harmonic Emissions," RFIC 2014, IEEE, pp. 239-242.
(Continued)

*Primary Examiner* — Quochien B Vuong
(74) *Attorney, Agent, or Firm* — White & Case LLP

(57) ABSTRACT

A power amplifier includes an output signal generator constructed to generate, on the basis of an input AC signal, an output signal including, in cycles, a first pulse being width higher in voltage than a first reference voltage and a second pulse being width lower in voltage than the first reference voltage and a feedback circuit constructed to generate a first bias signal corresponding to the output signal and feed back the first bias signal to an input side of the output signal generator to equalize a width of the first pulse and a width of the second pulse in the cycles of the output signal.

15 Claims, 7 Drawing Sheets

(51) Int. Cl.
*H03F 3/45* (2006.01)
*H03F 1/56* (2006.01)

(52) U.S. Cl.
CPC ............. *H03F 2200/387* (2013.01); *H04B 2001/0408* (2013.01)

(58) Field of Classification Search
CPC ...... H03F 1/083; H03F 1/0233; H03F 1/0272; H03F 1/189; H03F 1/523; H03F 1/3205; H03F 3/20; H03F 3/189; H03F 1/193; H03F 2200/78; H03F 2200/129; H03F 2200/153; H03F 2200/435; H03F 2200/451; H03F 2203/45112
USPC ......... 455/67.11, 114.1, 114.3, 115.1, 115.3, 455/126, 127; 330/75, 96, 102, 276, 290, 330/296, 297
See application file for complete search history.

(56) References Cited

U.S. PATENT DOCUMENTS

| | | | | |
|---|---|---|---|---|
| 7,474,149 B2* | 1/2009 | Snelgrove | ............ | H03F 1/0205 330/129 |
| 7,816,992 B2 | 10/2010 | Tanaka et al. | | |
| 7,839,218 B2* | 11/2010 | Shimamoto | ........... | H03F 1/0216 330/297 |
| 7,884,667 B2* | 2/2011 | Nam | ...................... | H03F 3/217 330/295 |
| 8,644,777 B2* | 2/2014 | Ripley | ................. | H03F 1/0261 455/127.1 |
| 8,738,066 B2* | 5/2014 | Akhi | ..................... | H03F 1/0261 455/127.1 |
| 9,031,520 B2* | 5/2015 | McCallister | ........ | H04B 1/0475 455/114.3 |
| 9,225,363 B2* | 12/2015 | Wu | ........................... | H03F 3/24 |
| 10,003,308 B2* | 6/2018 | Lam | ......................... | H03F 3/19 |

FOREIGN PATENT DOCUMENTS

| | | |
|---|---|---|
| JP | 4274204 B2 | 6/2009 |
| JP | 5056360 B2 | 10/2012 |

OTHER PUBLICATIONS

T. Sano, et al., "A 6.3mW BLE Transceiver Embedded RX Image-Rejection Filter and TX Harmonic-Suppression Filter Reusing On-Chip Matching Network," ISSCC 2015, pp. 240-.242.

* cited by examiner

… (1)

POWER AMPLIFIER AND WIRELESS COMMUNICATION DEVICE

CROSS-REFERENCE TO RELATED APPLICATIONS

This application is based upon and claims the benefit of priority from Japanese Patent Application No. 2018-007877, filed on Jan. 22, 2018; the entire contents of which are incorporated herein by reference.

FIELD

Embodiments disclosed herein relate to a power amplifier and a wireless communication device.

BACKGROUND

A power amplifier including an inverter is used for wireless communication and the like. In the wireless communication, because a usable band is limited, it is demanded to prevent occurrence of even-order harmonic components included in an output signal of the power amplifier.

DETAILED DESCRIPTION

Figure 1:
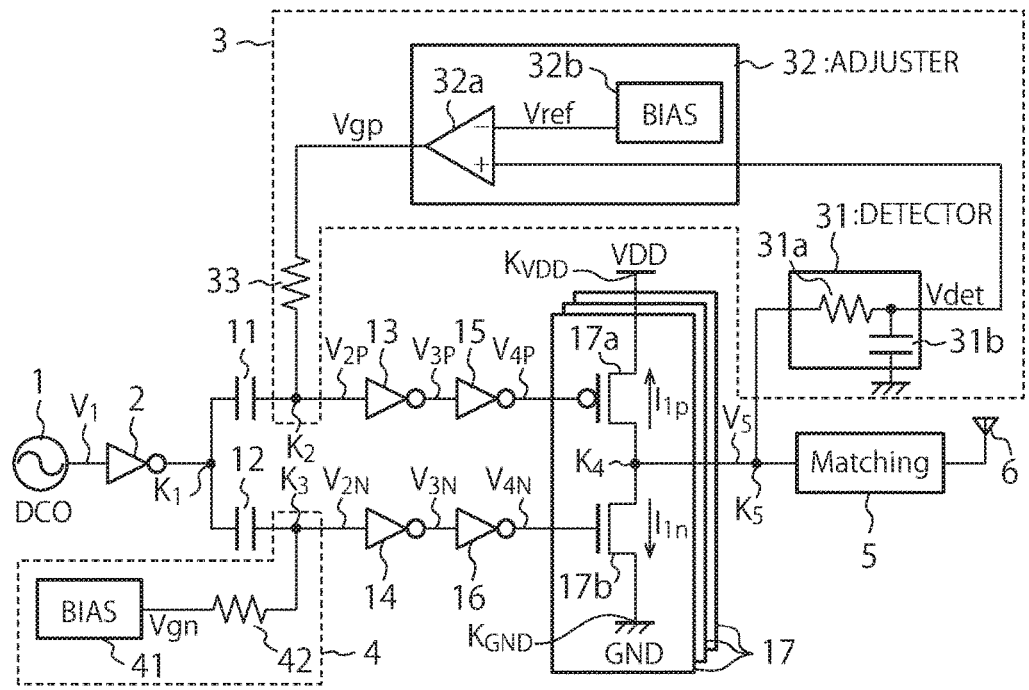
FIG. 1 is a circuit diagram showing the configuration of a power amplifier according to a first embodiment.

Embodiments of the present invention are explained below with reference to the drawings. Note that, in the drawings appended to this specification, for convenience of illustration and easiness of understanding, scales, aspect ratios, and the like are changed from actual ones and exaggerated.

(First Embodiment)

The configuration of a power amplifier is explained with reference to FIG. 1. FIG. 1 is circuit diagram showing the configuration of a power amplifier according to the first embodiment.

As shown in FIG. 1, the power amplifier includes a signal generator 1, an inverter 2, a feedback circuit 3, a bias supply circuit 4, a matching circuit 5, and an antenna 6. The feedback circuit 3 includes a detector 31, an adjuster 32, and an electric resistor 33. The detector 31 includes an electric resistor 31a and a capacitor 31b. The adjuster 32 includes a differential amplifier 32a and a bias circuit 32b. The bias supply circuit 4 includes a bias circuit 41 and an electric resistor 42.

The power amplifier shown in FIG. 1 further includes a first capacitor 11, a second capacitor 12, a first inverter 13, a second inverter 14, a third inverter 15, a fourth inverter 16, and a plurality of output signal generators 17 connected in parallel to one another.

The power amplifier according to this embodiment is used for wireless transmission conforming to, for example, the Bluetooth (registered trademark) standard. FIG. 1 shows components related to explanation of the wireless transmission in this embodiment. Illustration of known components unrelated to the explanation of this embodiment is omitted. Note that the matching circuit 5 and the antenna 6 may be components on the outside of the power amplifier according to this embodiment. The power amplifier shown in FIG. 1 can be implemented in a wireless communication device. When the power amplifier is implemented in the wireless communication device, the matching circuit 5 and the antenna 6 may be implemented in the same wireless communication device.

The signal generator 1 is a circuit that generates a signal and is, for example, a synthesizer or a digitally controlled oscillator (DCO). In FIG. 1, this signal is indicated by a sign $V_1$. The signal generator 1 generates a sine wave as the signal $V_1$. As the signal $V_1$ is propagated downstream, a waveform of the signal $V_1$ becomes closer to a rectangular wave because of the influence of inverters 2, 13, 14, 15, 16, and the like.

After passing through the inverter 2, in an input node $K_1$, the signal $V_1$ separates into a first signal supplied to the first capacitor 11 and a second signal supplied to the second capacitor 12. The first and second capacitors 11 and 12 respectively remove direct-current components (DC components) of the first and second signals.

After passing through the first and third inverters 13 and 15, the first signal passed through the first capacitor 11 is supplied to a gate terminal of a first transistor 17a. After passing through the second and fourth inverters 14 and 16, the second signal passed through the second capacitor 12 is supplied to a gate terminal of a second transistor 17b. Note that the number of inverters between the first capacitor 11 and the first transistor 17a and between the second capacitor 12 and the second transistor 17b is not limited to two and only has to be an even number.

The output signal generators 17 generate an output signal $V_5$ including, in cycles, a first pulse having a pulse width higher than a first reference voltage Vref by a first voltage and a second pulse having a pulse width lower than the first reference voltage Vref by a second voltage. The plurality of output signal generators 17 are connected in parallel to one another in the positions of frame lines surrounding the output signal generators 17. That is, a wire for inputting signals to the output signal generators 17 branches in nodes between the third inverter 15 and the output signal generators 17 and nodes between the fourth inverter 16 and the output signal generators 17. Wires for outputting signals from the output signal generators 17 merge in nodes between the output signal generators 17 and the matching circuit 5. Note that at least one output signal generator 17 only has to be provided. The number of the output signal generators 17 is adjusted according to characteristics of the antenna 6.

The feedback circuit 3 applies a first bias signal Vgp to the first signal such that a value of an average DC voltage Vdet of the output signal $V_5$ matches the first reference voltage Vref. In FIG. 1, the first signal immediately after the first bias signal Vgp is applied to a node $K_2$ between the first capacitor 11 and the first inverter 13 is indicated by a sign $V_{2P}$. The first signal after passing through the first inverter 13 is indicated by a sign $V_{3P}$. The first signal after passing through the third inverter 15 is indicated by a sign $V_{4P}$.

The bias supply circuit 4 applies a second bias signal Vgn to the second signal in a node $K_3$ between the second capacitor 12 and the second inverter 14. In FIG. 1, the second signal immediately after the second bias signal Vgn is applied is indicated by a sign $V_{2N}$. The second signal after passing through the second inverter 14 is indicated by a sign $V_{3N}$. The second signal after passing through the fourth inverter 16 is indicated by a sign $V_{4N}$. The bias supply circuit 4 adjusts a signal level of the second bias signal Vgn to thereby control the pulse widths of the first pulse and the second pulse in the cycles of the output signal $V_5$ of the output signal generators 17.

A detailed configuration of the output signal generator 17 is explained. The output signal generator 17 includes the first transistor 17a and the second transistor 17b having different conduction types from each other, cascode-connected between a first supply voltage node ($K_{VDD}$) and a second supply voltage node ($K_{GND}$). For example, the first and second transistors 17a and 17b are respectively a pMOS and an nMOS. The output signal generator 17 generates, on the basis of the signal $V_1$, an output signal including, in cycles, a first pulse having a pulse width higher than the first reference voltage Vref by a first voltage and a second puke having a pulse width lower than the first reference voltage Vref by a second voltage. The first reference voltage Vref is, for example, a half of a voltage VDD of a VDD wire. The first voltage and the second voltage have equivalent values. More specifically, the first transistor 17a includes a first control terminal (a gate) to which the signal $V_{4P}$ corresponding to the AC signal $V_1$ is input and a first output terminal (a drain) that outputs the first pulse at each cycle of the output signal $V_5$. The second transistor 17b includes a second control terminal (a gate) to which the signal $V_{4N}$ corresponding to the AC signal $V_5$ is input and a second output terminal (a drain) that outputs the second pulse at each cycle of the output signal $V_5$. The first output terminal (the drain) and the second output terminal (the drain) are connected to each other in a node $K_4$.

With such a circuit configuration, when a first signal $V_{4P}$ is supplied, the first transistor 17a outputs a first pulse current $I_{1P}$. When the second signal $V_{4N}$ is supplied, the second transistor 17b outputs a second pulse current $I_{1N}$. The first and second pulse currents $I_{1P}$ and $I_{1N}$ are respectively equivalent to drain currents of the first and second transistors 17a and 17b. As a result, the output signal $V_5$ including, in cycles, the first pulse and the second pulse is output from the output node $K_4$ between the first and second transistors 17a and 17b to the matching circuit 5. That is, the output signal $V_5$ is equivalent to a voltage in the output node $K_4$. The output signal $V_5$ is generated in the output signal generators 17 on the basis of the first pulse current $I_{1P}$ and the second pulse current $I_{1N}$ and output to the matching circuit 5.

Details of the feedback circuit 3 are explained. The feedback circuit 3 feeds back the first bias signal Vgp to a signal line connected to one of the first control terminal (the gate) of the first transistor 17a and the second control terminal (the gate) of the second transistor 17b. That is, the feedback circuit 3 generates the first bias signal Vgp corresponding to the output signal $V_5$ and feeds back the first bias signal Vgp to an input side of the output signal generator 17 such that the pulse widths of the first pulse and the second pulse in the cycles of the output signal $V_5$ are equalized.

The output signal $V_5$ is supplied to the detector 31 of the feedback circuit 3 as well. The detector 31 detects the average DC voltage Vdet of the output signal $V_5$. The detector 31 is, for example, a low-pass filter including the electric resistor 31a and the capacitor 31b and removes a high-frequency component of the output signal $V_5$. The output signal $V_5$, from which the high-frequency component is removed, is output to the adjuster 32 as the average DC voltage Vdet. Note that the detector 31 may have other configurations if the detector 31 is capable of removing the high-frequency component of the output signal $V_5$.

The adjuster 32 includes the differential amplifier 32a and the bias circuit 32b. The average DC voltage Vdet is input to a non-inverting input terminal (+) of the differential amplifier 32a from the detector 31. The first reference voltage Vref is input to an inverting input terminal (−) of the differential amplifier 32a from the bias circuit 41. The differential amplifier 32a is, for example, an operational amplifier and generates the first bias signal Vgp such that a value of the average DC voltage Vdet and a value of the first reference voltage Vref match. When a value of the first bias signal Vgp is changed, a pulse width of the first signal $V_{4P}$ is also changed. In other words, the adjuster 32 changes the pulse width of the first signal $V_{4P}$ such that the average DC voltage Vdet and the first reference voltage Vref match. Note that a reference voltage generator according to this embodiment corresponds to the bias circuit 32b.

Figure 2:
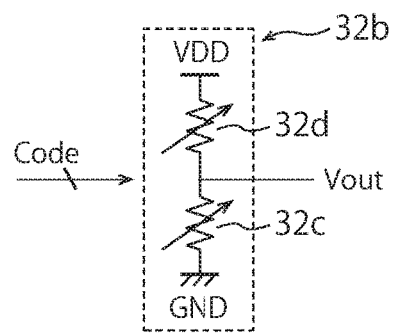
FIG. 2 is a circuit diagram showing the configuration of a bias circuit.

FIG. 2 is a circuit diagram showing the configuration of the bias circuit 32b. As shown in FIG. 2, the bias circuit 32b includes a first variable resistor 32c and a second variable resistor 32d connected in series between the VDD wire and a GND wire. The bias circuit 32b can control the value of the first reference voltage Vref by changing resistance values of the first variable resistor 32c and the second variable resistor 32d on the basis of an input code. Note that the bias circuit 32b includes the first variable resistor 32c and the second variable resistor 32d. However, the bias circuit 32b may have other configurations if the bias circuit 32b is capable of controlling the value of the first reference voltage Vref. The bias circuit 41 has a configuration equivalent to the configuration of the bias circuit 32b.

The first reference voltage Vref is set to an average DC voltage that should be obtained if the pulse widths of the first pulse and the second pulse in the cycles of the output signal $V_5$ are equal. The average DC voltage is, for example, a half of the voltage VDD of the VDD wire. Therefore, the first reference voltage Vref is set to VDD/2. In a value of the average DC voltage at the time when the pulse widths of the first pulse and the second pulse in the cycles of the output signal $V_5$ are equal, deviation of α could occur according to characteristics of the first and second transistors 17a and 17b. Therefore, the first reference voltage Vref may be set to VDD/2+α on the basis of, for example, the voltage of the VDD wire and the characteristics of the first and second transistors 17a and 17b. For example, the value of the first reference voltage Vref may be acquired in advance by a preliminary experiment.

The matching circuit 5 is provided for impedance matching between the output signal generator 17 and the antenna 6. The output signal $V_5$ of the output signal generator 17 is supplied to the antenna 6 passing through the matching circuit 5 and transmitted to the outside from the antenna 6.

In this way, the power amplifier according to this embodiment detects, with the detector 31, the average DC voltage Vdet of the output signal $V_5$ and changes, with the adjuster 32, a waveform of the output signal $V_5$ on the basis of the average DC voltage Vdet. Consequently, the power amplifier can adjust the waveform of the output signal $V_5$ such that the values of the average DC voltage Vdet and the first reference voltage Vref match. More specifically, the power amplifier according to this embodiment operates to match the value of the average DC voltage of the output signal $V_5$ with VDD/2, match the pulse widths of the first pulse and the second pulse in the cycles of the output signal $V_5$, and make the waveforms of the output signal $V_5$ in the cycles point symmetrical. Points of symmetry are set to points in time of half cycles in the cycles. Consequently, the waveform of the output signal $V_5$ becomes an odd function with respect to the points of symmetry. Even-order harmonics components are reduced to substantially zero.

The operation of the power amplifier according to this embodiment is explained in detail below.

FIGS. 3A to 3E are waveform charts for explaining the operation of the power amplifier according to the first embodiment. It is assumed that, when the pulse widths of the first pulse and the second pulse in the cycles of the output signal $V_5$ match, the output signal $V_5$ is referred to as being symmetrical. In this case, the first pulse and the second pulse are point symmetrical with respect to the points in time of the half cycles of the cycles, that is, the points of symmetry. The first reference voltage Vref is set to VDD/2.

Figure 3A:
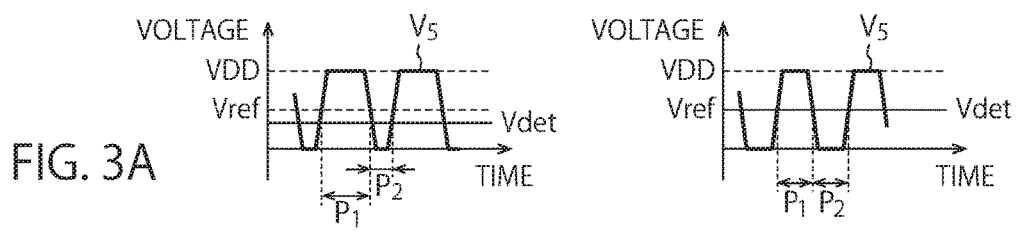
FIGS. 3A to 3E are waveform charts for explaining the operation of the power amplifier according to the first embodiment.
Figure 3B:
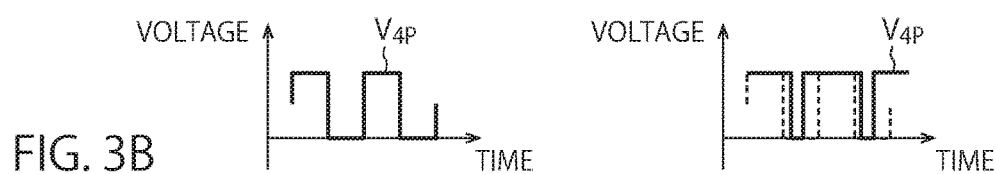

FIG. 3A shows an example of the output signal $V_5$ before the feedback circuit 3 acts thereon and the output signal $V_5$ after the feedback circuit 3 acts thereon. The width of the first pulse is indicated by $P_1$ and the width of the second pulse is indicated by $P_2$. Values of the average DC voltage Vdet and the first reference voltage Vref of the output signal $V_5$ before the action are different. In the output signal $V_5$ before the action, the pulse width $P_1$ of the first pulse and the pulse width $P_2$ of the second pulse do not match (the left in FIG. 3A). That is, the symmetry of the output signal $V_5$ is broken. On the other hand, the average DC voltage Vdet and the first reference voltage Vref after the action match. The pulse width $P_1$ of the first pulse and the pulse width $P_2$ of the second pulse match (the right in FIG. 3A). The feedback circuit 3 matches the average DC voltage Vdet and the first reference voltage Vref in this way, whereby the waveform of the output signal $V_5$ becomes point symmetrical, FIG. 3B shows an example of the first signal $V_{4P}$ before the feedback circuit 3 acts thereon and the first signal $V_{4P}$ after the feedback circuit 3 acts thereon. In the first signal $V_{4P}$ before the action, a high period and a low period have substantially equal lengths (the left in FIG. 3B). On the other hand, in the first signal $V_{4P}$ after the action, the high period changes to be longer than the low period (the right in FIG. 3B).

Figure 3C:
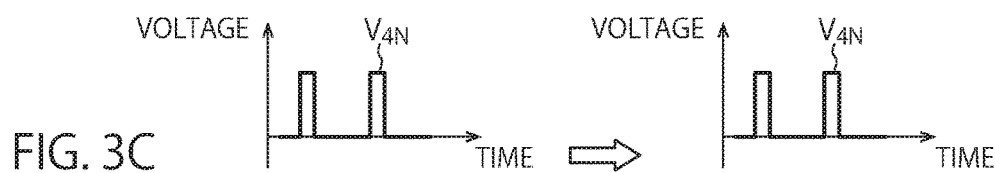

FIG. 3C shows an example of the second signal $V_{4N}$ before the feedback circuit 3 acts thereon (the left in FIG. 3C) and the second signal $V_{4N}$ after the feedback circuit 3 acts thereon (the right in FIG. 3C).

Figure 3D:
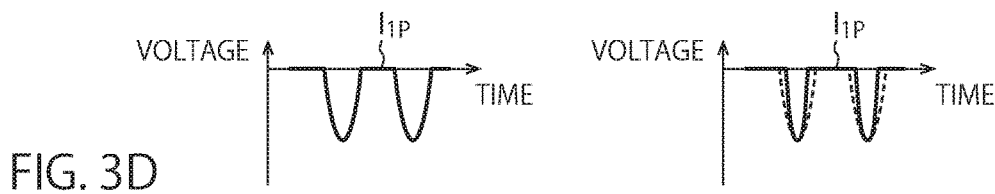

FIG. 3D shows an example of the first pulse current $I_{1P}$ before the feedback circuit 3 acts thereon and the first pulse current $I_{1P}$ after the feedback circuit 3 acts thereon. The first signal $V_{4P}$ changes as shown in FIG. 3B, whereby a pulse width of the first pulse current $I_{1P}$ after the action decreases.

Figure 3E:
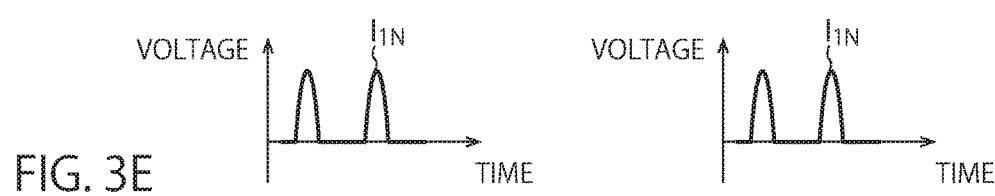

FIG. 3E shows an example of the second pulse current $I_{1N}$ before the feedback circuit 3 acts thereon and the second pulse current $I_{1P}$ after the feedback circuit 3 acts thereon. A pulse width of the second pulse current $I_{1N}$ after the action is also maintained without changing because the second signal $V_{4N}$ is maintained without changing as shown in FIG. 3C.

In this way, the first bias signal $V_{gp}$ is changed such that the pulse widths $P_1$ and $P_2$ of the first pulse and the second pulse of the output signal $V_5$ match. Consequently, the widths $P_1$ and $P_2$ of the first pulse and the second pulse match. As a result, even-order harmonic components included in the output signal $V_5$ are reduced and even-order harmonic components included in a signal output to the antenna 6 are reduced.

The bias supply circuit 4 adjusts the second bias signal Vgn applied to the second signal, whereby it is possible to change the waveform of the output signal $V_5$ while maintaining a state in which the pulse widths of the first pulse and the second pulse in the cycles of the output signal $V_5$ are matched. Consequently, it is possible to change an amount of a through-current flowing in the first and second transistors 17a and 17b. It is possible to adjust energy efficiency of wireless communication in this embodiment.

FIGS. 4A to 4E are other waveform charts for explaining the operation of the power amplifier according to the first embodiment. FIGS. 4A to 4E show a relation between application of the first bias signal Vgp by the feedback circuit 3 and a change in the first pulse current $I_{1P}$.

Figure 4A:
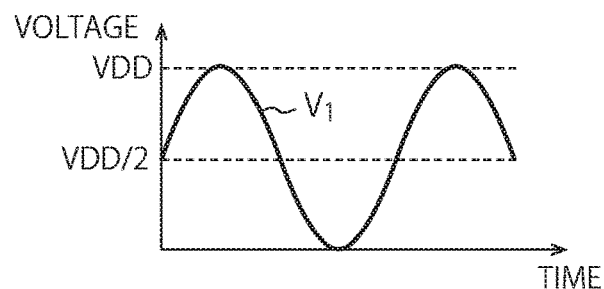
FIGS. 4A to 4E are other waveform charts for explaining the operation of the power amplifier according to the first embodiment.

FIG. 4A shows an example of the signal $V_1$ generated from the signal generator 1. The signal $V_1$ is a sine wave that fluctuates between a voltage 0 and the voltage VDD. A first voltage and a first pulse current generated from the signal $V_1$ are explained below.

Figure 4B:
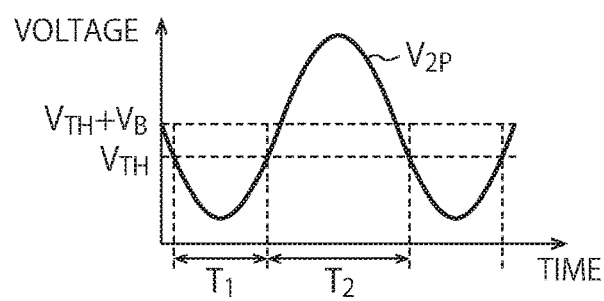

FIG. 4B shows a first signal $V_{2P}$ immediately after the first bias signal Vgp is applied. A vibrating direction of the first signal $V_{2P}$ is reversed from a vibrating direction of the signal $V_1$ by the action of the inverter 2. An average of the first signal $V_{2P}$ is higher than a threshold $V_{TH}$ of the first inverter 13 by $V_B$ because of the influence of the first bias signal Vgp. Further, FIG. 4B shows a period $T_1$ in which a value of the first signal $V_{2P}$ is lower than the threshold $V_{TH}$ and a period $T_2$ in which the value of the first signal $V_{2P}$ is higher than the threshold $V_{TH}$.

Figure 4C:
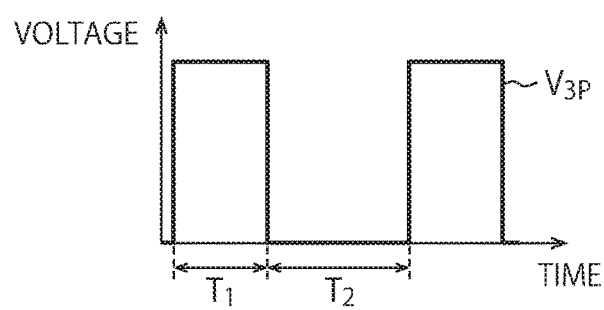

FIG. 4C shows a first signal $V_{3P}$ after passing through the first inverter 13. Because of the influence of the threshold $V_{TH}$, a waveform of the first signal $V_{3P}$ changes to a rectangular wave in which the period $T_1$ is shorter than the period $T_2$. Note that, accurately, the first signal gradually changes from the sine wave to the rectangular wave as the first signal is propagated downstream. However, for convenience of drawing, the first signal $V_{2P}$ is indicated by the sine wave and the first signal $V_{3P}$ is indicated by the rectangular wave.

Figure 4D:
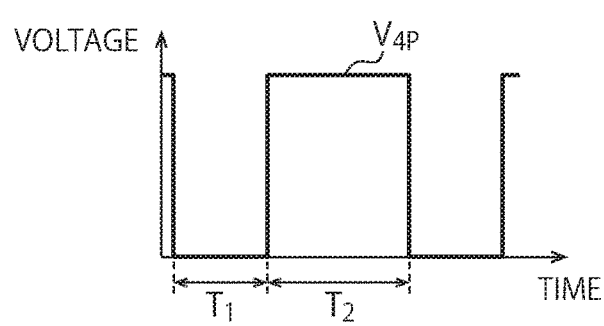

FIG. 4D shows a first signal $V_{4P}$ after passing through the third inverter 15. Because of the action of the third inverter 15, a waveform of the first signal $V_{4P}$ changes to a rectangular wave in which the period $T_1$ is shorter than the period $T_2$.

Figure 4E:
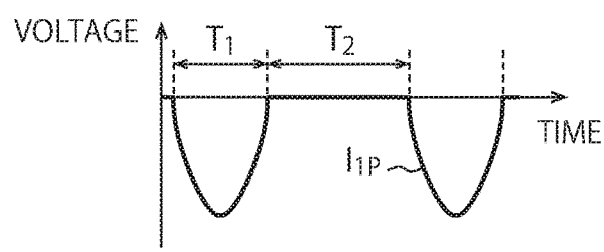

FIG. 4E shows the first pulse current $I_{1P}$ output from the first transistor 17a. A pulse width of the first pulse current $I_{1P}$ changes to $T_1$ because of the influence of the period $T_1$ of the first signal $V_{4P}$.

In this way, the period $T_1$ of the first signal $V_{4P}$ changes according to the first bias signal Vgp. Consequently, the pulse width of the first pulse current $I_{1P}$ changes. As a result, as shown on the right of FIG. 3A, the pulse widths of the first pulse and the second pulse in the cycles of the output signal $V_5$ can be matched. Consequently, the waveforms of the output signal $V_5$ (FIG. 1) in the cycles become point symmetrical.

Figure 5:
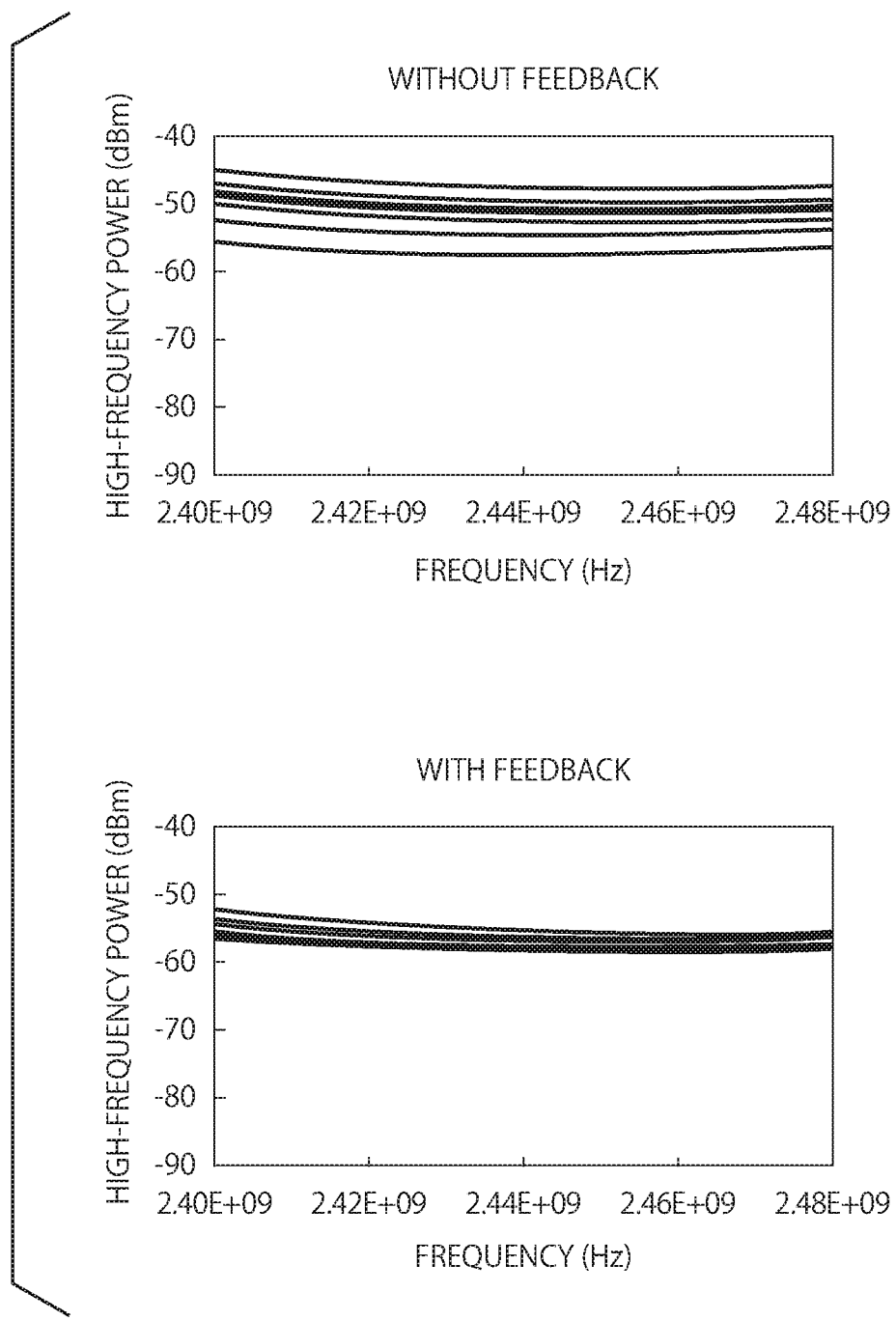
FIG. 5 is a graph for explaining the performance of the power amplifier according to the first embodiment.

FIG. 5 is a graph for explaining the performance of the power amplifier according to the first embodiment. A power supply voltage VDD, temperature, and a frequency of an input signal V1 were respectively changed and a computer experiment for calculating harmonic components of the output signal $V_5$ was performed. The upper side of FIG. 5 shows a result obtained when the feedback circuit 3 is not used. The lower side of FIG. 5 shows a result obtained when the feedback circuit 3 is used. The vertical axis of FIG. 5 indicates power of harmonics of the output signal $V_5$. The horizontal axis of FIG. 5 indicates a frequency of the output signal $V_5$. Respective lines indicate results obtained by changing the power supply voltage VDD, the temperature, and the frequency of the input signal V1.

As shown in FIG. 5, when the feedback circuit 3 is not used, a value of the harmonic components of the output signal $V_5$ shows fluctuation with respect to fluctuation in the power supply voltage VDD, the temperature, and the frequency of the input signal V1. On the other hand, when the feedback circuit 3 is used, even if the power supply voltage VDD, the temperature, and the frequency of the input signal V1 fluctuate, the fluctuation in the value of the harmonic components of the output signal $V_5$ is shown smaller than when the feedback circuit 3 is not used. As it is seen from this, by using the feedback circuit 3, even if the power supply voltage VDD, the temperature, and the frequency of the input signal V1 fluctuate, it is possible to robustly reduce the harmonic components of the output signal $V_5$. In other words, by using the feedback circuit 3, even if the power supply voltage VDD, the temperature, and the frequency of the input signal V1 fluctuate, it is possible to prevent the symmetry of the waveform of the output signal $V_5$ from being broken.

As explained above, according to this embodiment, when the first reference voltage Vref is set to the value of the average DC voltage obtained when the waveform of the output signal $V_5$ becomes symmetrical, the feedback circuit 3 changes the first bias signal Vgp such that the pulse widths of the first pulse and the second pulse in the cycles of the output signal $V_5$ are equalized. Consequently, the symmetry of the waveform of the output signal $V_5$ is improved. The even-order harmonic components are prevented from being included in the output signal $V_5$.

(Second Embodiment)

Figure 6:
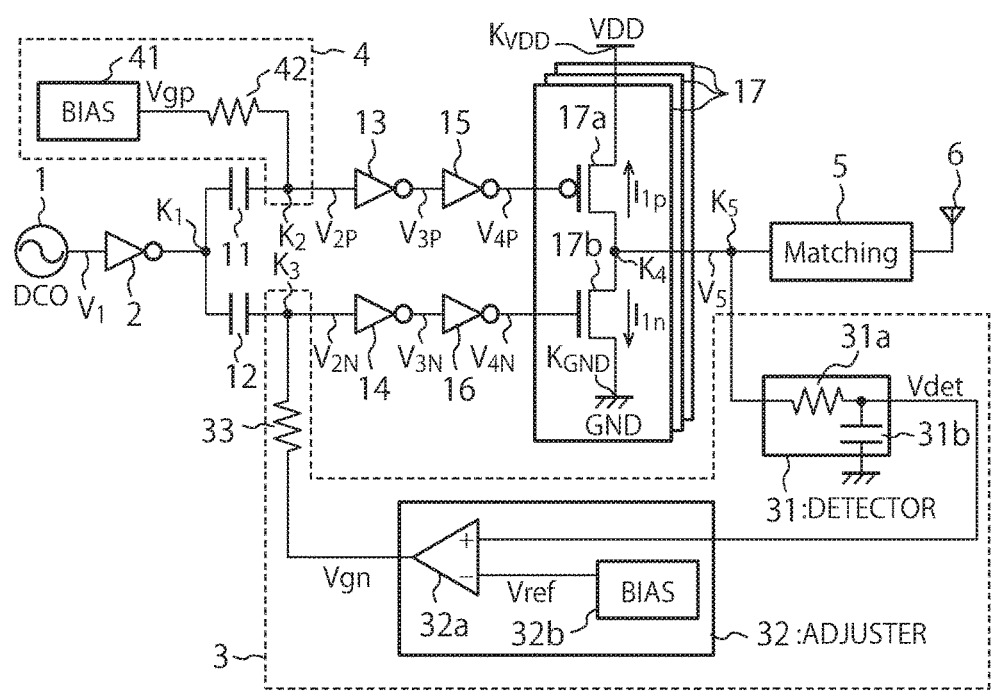
FIG. 6 is a circuit diagram showing the configuration of a power amplifier according to a second embodiment.

FIG. 6 is a circuit diagram showing the configuration of a power amplifier according to a second embodiment. The power amplifier according to the second embodiment is different from the power amplifier according to the first embodiment in that the feedback circuit 3 applies the second bias signal Vgn to the second signal in the node $K_3$ between the second capacitor 12 and the second inverter 14. The power amplifier according to the second embodiment is different from the power amplifier according to the first embodiment in that the bias supply circuit 4 applies the first bias signal Vgp to the first signal in the node $K_2$ between the first capacitor 11 and the first inverter 13. The other components are equivalent to the components of the power amplifier according to the first embodiment. Therefore, the equivalent components are denoted by the same reference numerals and signs and explanation of the components is omitted.

According to this embodiment, when the first reference voltage Vref is set to the value of the average DC voltage obtained when the waveform of the output signal $V_5$ becomes symmetrical, the feedback circuit 3 changes the second bias signal Vgn such that the pulse widths of the first pulse and the second pulse in the cycles of the output signal $V_5$ are equalized. Consequently, the symmetry of the waveform of the output signal $V_5$ is improved. The even-order harmonic components are prevented from being included in the output signal $V_5$.

(Third Embodiment)

The power amplifier according to the third embodiment is different from the power amplifier according to the second embodiment in that the power amplifier according to the third embodiment further includes a pre-driver 7 used during startup of the power amplifier. When the feedback circuit 3 is driven during the startup of the power amplifier, it is likely that the feedback circuit 3 performs an unstable operation and an unnecessary wave component occurs in an output signal of the power amplifier. Therefore, the power amplifier according to this embodiment electrically separates the feedback circuit 3 from the power amplifier during the startup of the power amplifier and causes the pre-driver 7 to pre-drive the differential amplifier 32*a*.

Figure 7:
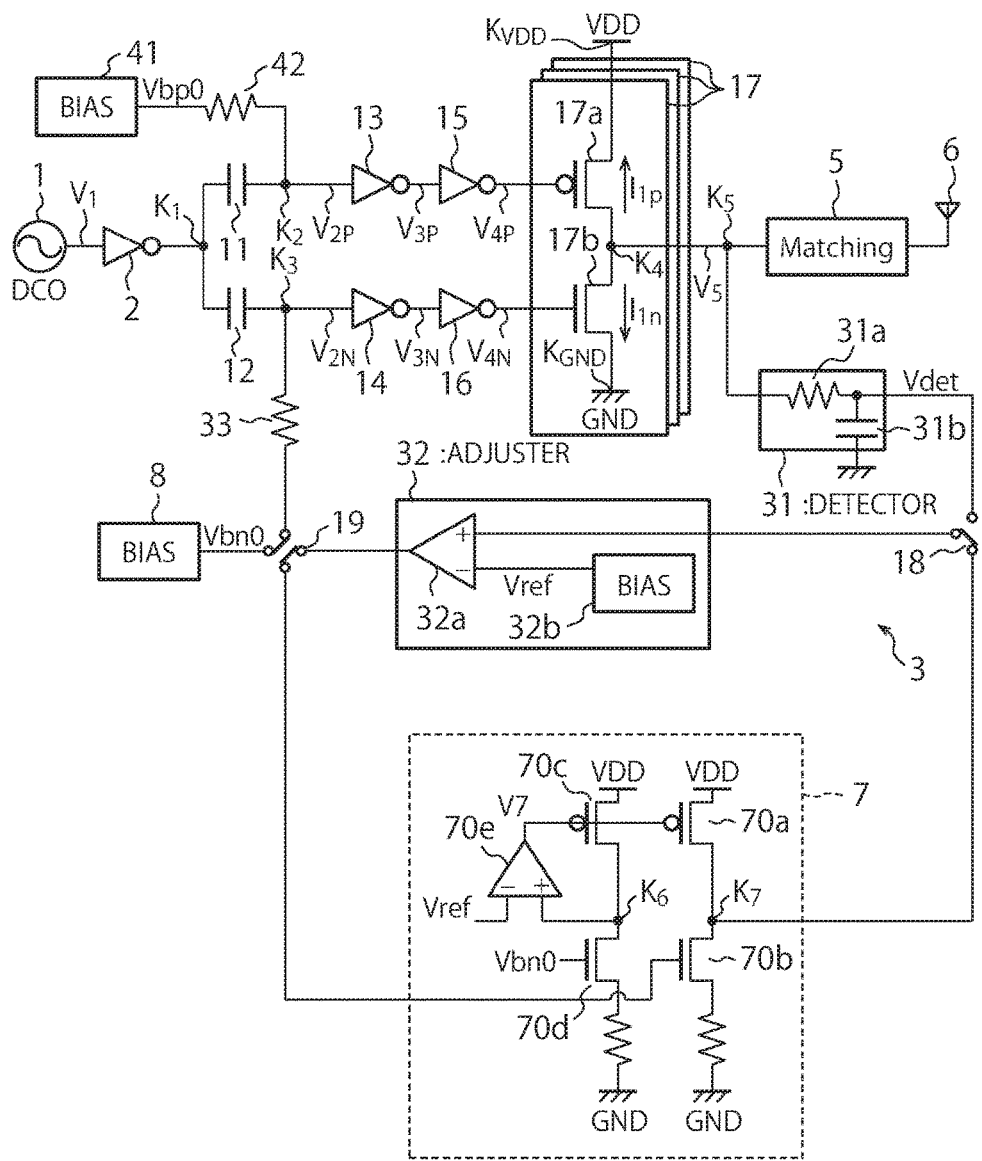
FIG. 7 is a circuit diagram showing the configuration of a power amplifier according to a third embodiment.
Figure 8:
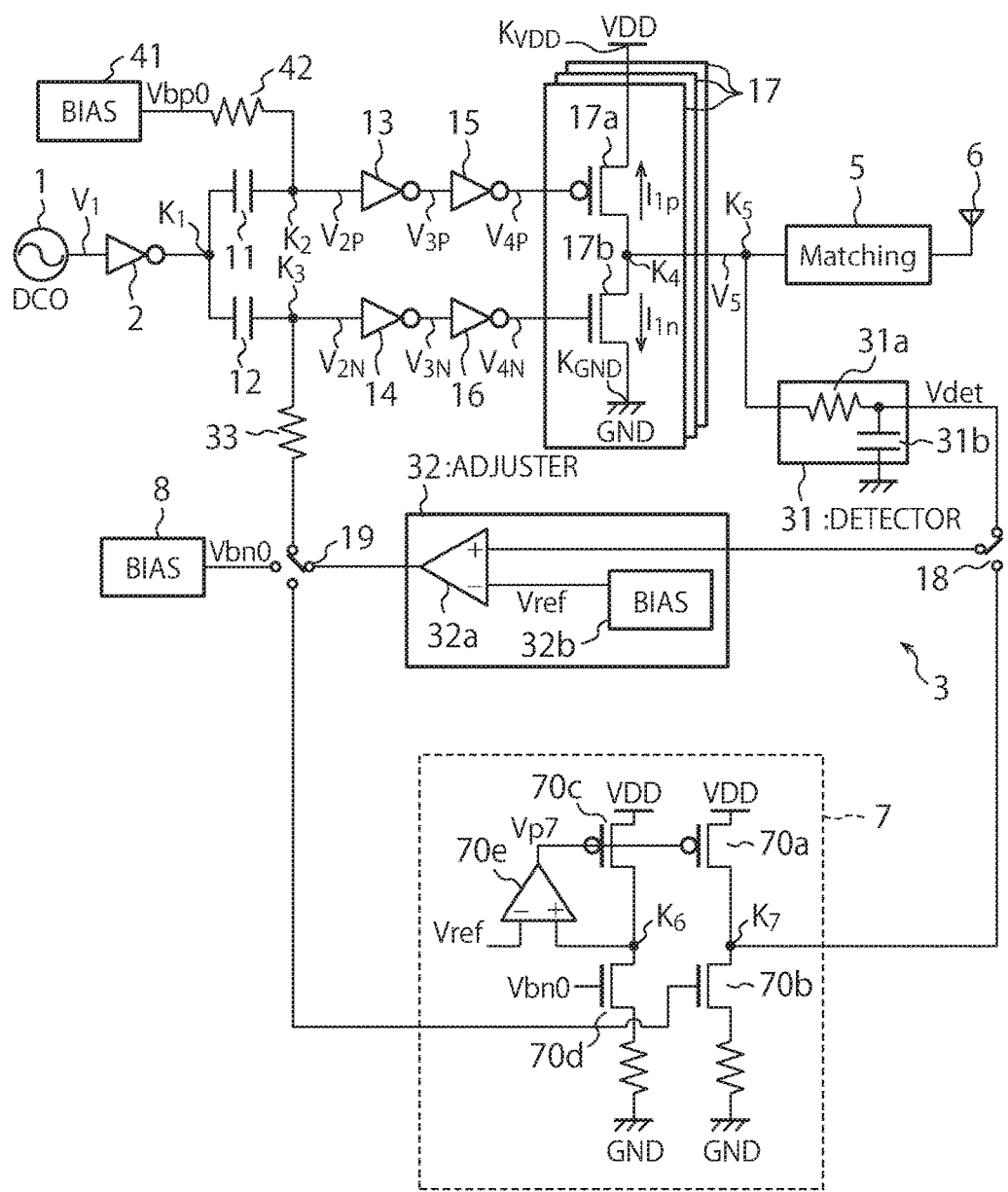
FIG. 8 is a diagram showing a connection state example during normal operation of the power amplifier according to the third embodiment.

FIG. 7 is a circuit diagram showing the configuration of the power amplifier according to the third embodiment. In FIG. 7, a connection state example during the pre-drive of the differential amplifier 32*a* is shown. FIG. 8 is a circuit diagram showing a connection state example during normal operation of the power amplifier according to the third embodiment.

As shown in FIG. 7, the power amplifier according to the third embodiment includes the pre-driver 7, a bias circuit 8, and changeover switches 18 and 19. Note that the power amplifier according to the third embodiment may include the pre-driver 7, the bias circuit 8, and the changeover switches 18 and 19 in addition to the components shown in FIG. 1. In this case, control equivalent to the pre-drive according to this embodiment can be performed on the differential amplifier 32*a*.

In the pre-drive of the differential amplifier 32*a*, the pre-driver 7 controls a voltage input to the non-inverting input terminal of the differential amplifier 32*a* to be the first reference voltage Vref and controls an output voltage of the differential amplifier 32*a* to be an initial voltage Vbn0.

The bias circuit 8 has a configuration equivalent to the configuration of the bias circuit 32*b*. The bias circuit 8 supplies the initial voltage Vbn0 to the node $K_3$ during the pre-drive of the differential amplifier 32*a*. Consequently, the initial voltage Vbn0 is supplied to the gate of the second transistor 17*b*. On the other hand, the bias circuit 41 supplies an initial voltage Vbp0 to the node $K_2$ during the pre-drive of the differential amplifier 32*a*. The initial voltages Vbn0 and Vbp0 are values set by a preliminary experiment in advance.

As shown in FIG. 8, in the connection state during the normal operation of the power amplifier, when the initial voltage Vbp0 is applied to the node $K_2$, the output voltage of the differential amplifier 32*a* reaches near Vbn0. In other words, an output voltage normally output by the differential amplifier 32*a* when the initial voltage Vbp0 is supplied to the node $K_2$ is estimated by the predetermined experiment and set as the initial voltage Vbn0.

The changeover switches 18 and 19 electrically separate the adjuster 32 from the power amplifier during the pre-drive and electrically connects the adjuster 32 to the power amplifier during the normal operation. That is, the changeover switches 18 and 19 switch connection of the pre-driver 7, the bias circuit 8, and the adjuster 32. More specifically, as shown in FIG. 7, the changeover switches 18 and 19 connect the adjuster 32 to the pre-driver 7 and connect the bias circuit 8 to one end of the electric resistor 33 when the differential amplifier 32*a* is pre-driven. On the other hand, as shown in FIG. 8, when differential amplifier 32*a* is normally driven, the changeover switches 18 and 19 connect the adjuster 32 to one end of the electric resistor 33 and one end of the detector 31. Note that a switcher according to this embodiment corresponds to the changeover switches 18 and 19.

A detailed configuration of the pre-driver 7 is explained. The pre-driver 7 includes a third transistor 70a, a fourth transistor 70b, a fifth transistor 70c, a sixth transistor 70d, and a differential amplifier 70e.

The third transistor 70a and the fourth transistor 70b are connected in series between a power supply wire (a VDD wire) and a ground wire (a GND wire). Similarly, the fifth transistor 70c and the sixth transistor 70d are connected in series between the power supply wire (the VDD wire) and the ground wire (the GND wire). The third transistor 70a and the fifth transistor 70c are pMOSs having equivalent characteristics. The fourth transistor 70b and the sixth transistor 70d are nMOSs having equivalent characteristics.

The differential amplifier 70e is, for example, an operational amplifier. A connection node $K_7$ of the third transistor 70a and the fourth transistor 70b is connected to one end of the changeover switch 18. A gate of the fourth transistor 70b is connected to one end of the changeover switch 19. A connection node $K_6$ of the fifth transistor 70c and the sixth transistor 70d is connected to a non-inverting input terminal (+) of the differential amplifier 70e. The first reference voltage Vref is input to an inverting input terminal (−) of the differential amplifier 70e. An output terminal of the differential amplifier 70e is connected to gates of the third transistor 70a and the fifth transistor 70c.

The operation of the pre-driver 7 is explained. During driving, the node $K_7$ of the third transistor 70a and the fourth transistor 70b is connected to the non-inverting input terminal (+) of the differential amplifier 32a by the changeover switch 18. The gate of the fourth transistor 70b is connected to an output terminal of the differential amplifier 32a by the changeover switch 19. The first reference voltage Vref is supplied to the inverting input terminal (−) of the differential amplifier 32a. The initial voltage Vbn0 is supplied to the gate of the sixth transistor 70d. The node $K_3$ is connected to the bias circuit 8 via the resistor 33 by the changeover switch 19. The initial voltage Vbn0 is supplied to the node $K_3$.

On the other hand, at normal time, one end of the detector 31 is connected to the non-inverting input terminal (+) of the differential amplifier 32a by the changeover switch 18. The node $K_3$ is connected to the differential amplifier 32a via the resistor 33 by the changeover switch 19.

As it is seen from the above, during the driving of the pre-driver 7, a voltage in the connection node $K_6$ changes to the first reference voltage Vref according to feedback action of the differential amplifier 70e. On the other hand, an output voltage Vp7 of the differential amplifier 70e is supplied to the gates of the third transistor 70a and the fifth transistor 70c. Therefore, when the voltage Vbn0 is supplied to the gate of the sixth transistor 70d, a voltage in the connection node $K_7$ changes to the first reference voltage Vref as in the connection node $K_6$. When the pre-driver 7 in this state is connected to the adjuster 32, a voltage input to the non-inverting input terminal (+) of the differential amplifier 32a changes to the first reference voltage Vref. The output voltage of the differential amplifier 32a changes to the initial voltage Vbn0. The pre-driver 7 switches the changeover switches 18 and 19 and shifts to the operation at the normal time. That is, the pre-driver 7 sets a bias signal generated by the differential amplifier 32a to a predetermined value (the initial voltage Vbn0) and thereafter feeds back the bias signal to the input side of the output signal generator 17. In this way, during the driving, in a state in which the bias signal generated by the differential amplifier 32a is not fed back to the output signal generator 17, the pre-driver 7 brings the differential amplifier 32a into a state close to the normal state.

As explained above, according to this embodiment, the feedback circuit 3 is electrically separated from the power amplifier during the startup of the power amplifier. When an operation state of the differential amplifier 32a is brought into a state equivalent to an operation state at the normal time by the pre-driver 7, the feedback circuit 3 is connected to the power amplifier. Consequently, the power amplifier can be operated in a stable state from the startup time. An unnecessary wave component is prevented from occurring in an output signal of the power amplifier.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A power amplifier comprising:
an output signal generator constructed to generate, on the basis of an input AC signal, an output signal including, in cycles, a first pulse being higher in voltage than a first reference voltage and a second pulse being lower in voltage than the first reference voltage; and
a feedback circuit constructed to generate a first bias signal corresponding to the output signal and feed back the first bias signal to an input side of the output signal generator to equalize a width of the first pulse and a width of the second pulse in the cycles of the output signal, wherein
the output signal generator includes a first transistor and a second transistor having different conduction types from each other, the first transistor and the second transistor being cascode-connected between a first supply voltage node and a second supply voltage node,
the first transistor includes a first control terminal to which a signal corresponding to the AC signal is input and a first output terminal constructed to output the first pulse at each cycle of the output signal,
the second transistor includes a second control terminal to which a signal corresponding to the AC signal is input and a second output terminal constructed to output the second pulse at each cycle of the output signal,
the first output terminal and the second output terminal are connected to each other, and
the feedback circuit feeds back the first bias signal to a signal line connected to one of the first control terminal and the second control terminal.

2. The power amplifier according to claim 1, wherein the feedback circuit further includes:
a detector constructed to detect an average DC voltage of the output signal; and
a differential amplifier constructed to generate the first bias signal such that the average DC voltage matches a first reference voltage.

3. The power amplifier according to claim 2, further comprising:
a switcher constructed to switch whether to feed back the first bias signal to the input side of the output signal generator; and a pre-driver constructed to stabilize an output signal of the differential amplifier in a state in which the first bias signal is not feed back to the input side of the output signal generator by the switcher, wherein the switcher causes the pre-driver to set the output signal of the differential amplifier to a predetermined value and thereafter feeds back the first bias signal.

4. The power amplifier according to claim 1, further comprising a bias supply circuit constructed to supply a second bias signal to a signal line connected to the other of the first control terminal and the second control terminal.

5. The power amplifier according to claim 4, wherein the bias supply circuit adjusts a signal level of the second bias signal to thereby control the widths of the first pulse and the second pulse.

6. The power amplifier according to claim 1, further comprising a reference voltage generator constructed to adjust a voltage level of the first reference voltage such that the width of the first pulse and the width of the second pulse match.

7. The power amplifier according to claim 1, wherein the output signal generator generates the output signal having a point-symmetrical waveform having time points of half cycles in the cycles as points of symmetry.

8. A wireless communication device comprising a power amplifier, the power amplifier including:
   an output signal generator constructed to generate, on the basis of an input AC signal, an output signal including, in cycles, a first pulse being higher in voltage than a first reference voltage and a second pulse being lower in voltage than the first reference voltage; and
   a feedback circuit constructed to generate a first bias signal corresponding to the output signal and feed back the first bias signal to an input side of the output signal generator to equalize a width of the first pulse and a width of the second pulse in the cycles of the output signal, wherein
   the output signal generator includes a first transistor and a second transistor having different conduction types from each other, the first transistor and the second transistor being cascode-connected between a first supply voltage node and a second supply voltage node,
   the first transistor includes a first control terminal to which a signal corresponding to the AC signal is input and a first output terminal constructed to output the first pulse at each cycle of the output signal,
   the second transistor includes a second control terminal to which a signal corresponding to the AC signal is input and a second output terminal constructed to output the second pulse at each cycle of the output signal,
   the first output terminal and the second output terminal are connected to each other, and
   the feedback circuit feeds back the first bias signal to a signal line connected to one of the first control terminal and the second control terminal.

9. The wireless communication device according to claim 8, wherein the feedback circuit includes:
   a detector constructed to detect an average DC voltage of the output signal; and
   a differential amplifier constructed to generate the first bias signal such that the average DC voltage matches a first reference voltage.

10. The wireless communication device according to claim 9, wherein
    the power amplifier further includes:
    a switcher constructed to switch whether to feed back the first bias signal to the input side of the output signal generator; and
    a pre-driver constructed to stabilize an output signal of the differential amplifier in a state in which the first bias signal is not feed back to the input side of the output signal generator by the switcher, and
    the switcher converges the output signal of the differential amplifier a predetermined value to the pre-driver and thereafter feeds back the first bias signal.

11. The wireless communication device according to claim 10, wherein the power amplifier further includes a reference voltage generator constructed to adjust a voltage level of the first reference voltage such that the width of the first pulse and the width of the second pulse match.

12. The wireless communication device according to claim 8, wherein the power amplifier further includes a bias supply circuit constructed to supply a second bias signal to a signal line connected to the other of the first control terminal and the second control terminal.

13. The wireless communication device according to claim 12, wherein the bias supply circuit adjusts a signal level of the second bias signal to thereby control the widths of the first pulse and the second pulse.

14. The wireless communication device according to claim 8, wherein the output signal generator generates the output signal having a point-symmetrical waveform having time points of half cycles in the cycles as points of symmetry.

15. A power amplifier comprising:
    an output signal generator constructed to generate, on the basis of an input AC signal, an output signal including, in cycles, a first pulse being higher in voltage than a first reference voltage and a second pulse being lower in voltage than the first reference voltage; and
    a feedback circuit constructed to generate a first bias signal corresponding to the output signal and feed back the first bias signal to an input side of the output signal generator to equalize a width of the first pulse and a width of the second pulse in the cycles of the output signal, wherein
    the output signal generator includes a first transistor, a second transistor, and an output terminal,
    the first transistor includes a first control terminal to which a signal corresponding to the AC signal is input and a first output terminal constructed to output the first pulse at each cycle of the output signal,
    the second transistor includes a second control terminal to which a signal corresponding to the AC signal is input and a second output terminal constructed to output the second pulse at each cycle of the output signal,
    the output terminal constructed to output the output signal based on the first pulse from the first output terminal and the second pulse from the second output terminal, and
    the feedback circuit feeds back the first bias signal to a signal line connected to one of the first control terminal and the second control terminal.

* * * * *